United States Patent
Mayer

(10) Patent No.: US 7,129,157 B2
(45) Date of Patent: Oct. 31, 2006

(54) METHOD FOR FABRICATING AN INTEGRATED CIRCUIT

(75) Inventor: Albrecht Mayer, Deisenhofen (DE)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 10/831,455

(22) Filed: Apr. 23, 2004

(65) Prior Publication Data

US 2004/0245618 A1   Dec. 9, 2004

(30) Foreign Application Priority Data

Apr. 25, 2003  (DE) ................ 103 18 847

(51) Int. Cl.
*H01L 21/44* (2006.01)
(52) U.S. Cl. ............... 438/598; 438/599
(58) Field of Classification Search ........... 43/598; 438/598–599

See application file for complete search history.

(56) References Cited

U.S. PATENT DOCUMENTS 6,406,980 B1   6/2002 Amatangelo et al.
6,787,904 B1 *  9/2004 Koyama et al. ............ 257/735
2002/0136046 A1   9/2002 Kim et al.
2003/0180670 A1 *  9/2003 Hasegawa et al. .......... 430/494

FOREIGN PATENT DOCUMENTS

DE   101 00 344 A1   7/2002

* cited by examiner

*Primary Examiner*—Thanh Nguyen
(74) *Attorney, Agent, or Firm*—Dickstein, Shapiro, LLP.

(57) ABSTRACT

In an integrated circuit having a first circuit part and at least one second circuit part, which is assigned to a specific functionality of the first circuit part, on one and the same silicon wafer, of which the first circuit part and the at least one circuit part are arranged in non-overlapping, mutually separate regions of the silicon wafer and are connected to one another via connecting elements or lines, during the fabrication, for each exposure plane, with the exception of the exposure plane used for the fabrication of the connecting elements or lines, use is made in each case of a first exposure mask intended for the first circuit part and a second exposure mask intended for the second circuit part. These first and second exposure masks may be arranged on a common reticle for a respective exposure plane.

7 Claims, 4 Drawing Sheets

METHOD FOR FABRICATING AN INTEGRATED CIRCUIT

FIELD OF THE INVENTION

The invention relates to an integrated circuit having a first circuit part and at least one second circuit part, which is assigned to a specific functionality of the first circuit part, on one and the same silicon wafer, of which the first and the at least one second circuit part are arranged in non-overlapping and mutually separate regions of the silicon wafer and are connected to one another via signal/supply connecting elements or lines, and to a method for fabricating an integrated circuit of this type. Such an integrated circuit and a fabrication method are disclosed in each case in German patent application 101 00 344.7 by Infineon Technologies AG.

BACKGROUND OF THE INVENTION

Integrated circuits, principally on account of the ever increasing complexity and the ever higher speed, have the problem that the users of the integrated circuits, more precisely the users of the modules and devices containing the integrated circuits, are often no longer able to identify or to eliminate the causes of improper functioning of the integrated circuits and/or of the systems containing the integrated circuits.

For this reason, so-called emulators have been developed for particularly complex integrated circuits, for example for microprocessors and microcontrollers, with the aid of which emulators, during the normal operation of an integrated circuit, internal states and sequences in the integrated circuit, such as, for example, register contents, memory contents and/or addresses, data, control signals transferred via internal, or external lines or bus systems, etc., can be observed and altered as desired.

During an emulation of an integrated circuit, the latter would generally be removed from the system containing it and be replaced by a special circuit, the special circuit containing the integrated circuit itself that is to be tested or a particular version of the integrated circuit (a so-called bond-out version having additional terminals for observing internal states and operations).

The above-mentioned integrated circuit disclosed in DE 101 00 344.7 was based on the object of providing a particularly suitable and simple possibility of emulation for complex integrated circuits by virtue of the integrated circuit comprising, in addition to a first circuit part, for example a processor or controller part, a second circuit part, which is necessary or useful for the emulation thereof, alongside of the first circuit part on the same silicon wafer.

During the fabrication of the integrated circuit, an exposure mask is used for each exposure plane, patterns for fabricating a first circuit part of the integrated circuit and patterns for fabricating a second circuit part thereof being situated jointly on said exposure mask, in which case, during the fabrication of a variant which does not contain the second circuit part, that part of the exposure mask which serves for fabricating the second circuit part is covered and, during the fabrication of a variant of the integrated circuit which has the second circuit part, the relevant part of the exposure mask remains uncovered.

The known procedure is explained in more detail with reference to the accompanying diagrammatic FIGS. 6A, 6B, 6C, 7 and 8.

FIGS. 6A, 6B and 6C firstly show, in diagrammatic plan view, three different integrated circuits such as are known from the abovementioned DE 101 00 344.7. In accordance with FIG. 6A, a first integrated circuit IC1 has a first circuit part 1 and a second circuit part 21. As mentioned, the first circuit part 1 is a processor circuit, for example, and the second circuit part 21 is an emulator circuit which is used for the emulation of the first circuit part 1 but is integrated-separately from the latter along one side (the upper side in FIG. 6A) of the first circuit part 1. Connecting lines between the first circuit part 1 and the second circuit part 21 are provided but are not illustrated for the sake of simplicity.

A variant of the integrated circuit that is designated by IC2 is illustrated diagrammatically in FIG. 6B. Here, the second circuit part designated by the numeral 22 is integrated separately from the first circuit part 1, however, along two sides thereof. In the two variants shown in FIGS. 6A and 6B, the first circuit part 1 and the second circuit part 21 and 22, respectively, are neither interleaved in one another nor do their respective regions overlap.

FIG. 6C diagrammatically illustrates a variant of the integrated circuit that is designated by IC3, which does not have a second circuit part. The procedure in mass production is usually such that very many integrated circuits IC3 in accordance with FIG. 6C and a few integrated circuits IC1 or IC2 in accordance with FIG. 6A or FIG. 6B are fabricated on a wafer. In FIGS. 6A–6C, connecting lines of the integrated circuit are designated by 3 and terminal points are designated by 4.

FIGS. 7 and 8 show that, during the method for fabricating the known integrated circuit, for each exposure plane with an exposure mask 10, which has regions for the first circuit part 1 and in addition for the second circuit part 2, it is possible to fabricate an integrated circuit IC1 in accordance with FIG. 6A and an integrated circuit IC3 in accordance with FIG. 6C, that is to say without a first circuit part.

For this purpose, regions of the exposure mask 10 are either not covered (FIG. 7) or are covered (FIG. 8) by displaceable sections S1, S3 of a diaphragm S having the sections S1, S2, S3 and S4. The arrows m illustrate that the sections S1 and S3 of the diaphragm S are displaceable in this way.

One problem in the case of the known method outlined above is that a relatively large distance has to be complied with in each case between the first mask region serving for the production of the first circuit part and the mask region serving for the production of the second circuit part, which distance unfortunately cannot be made arbitrarily small on account of the unsharpness during the imaging of the diaphragm sections S1, S3. Therefore, too much space on the wafer is given away during the mass production of an integrated circuit in accordance with FIG. 8.

SUMMARY OF THE INVENTION

The present invention is directed to an integrated circuit of the generic type and a method for fabricating an integrated circuit in such a way that an expensive combined mask set, that is to say a mask set containing the regions for fabricating the first circuit part and second circuit part, can be avoided, in particular in cases where only chips with a small production volume are fabricated.

In accordance with one essential aspect of the invention, an integrated circuit is provided wherein the first and the at least one second circuit part are formed on the silicon wafer in such a way that each exposure plane used for their production, with the exception of the exposure plane or planes used for fabricating the connecting elements or lines, can in each case be implemented with a first and second exposure mask which belong to, in each case, a first and second mask set intended for the first and second circuit part.

In an advantageous manner, the first circuit part and the second circuit part are connected to one another in such a way that the first circuit part behaves, in terms of its functions, with the exception of the specific functionality, when the second circuit part is not present, in exactly the same way as is the case when the second circuit part is present.

The separate regions of the first circuit part and of the second circuit part are not interleaved in one another on the silicon wafer, nor do they overlap.

Preferably, the first circuit part is a circuit fabricated in mass production, the second circuit part being fabricated only for a specific fraction of the first circuit parts (e.g., the second circuit part is only produced during the fabrication of test devices, and is omitted during the fabrication of "production" devices).

As already mentioned, the first circuit part may be a program-controlled processor or controller circuit and the second circuit part is an emulator circuit for the first circuit part.

It should be pointed out, however, that the particular features explained below for the integrated circuit described can also be provided for any other integrated circuits in which there is a need to extend their functionality and/or performance as required. Such a further application of the principle according to the invention exists in the case of a DRAM block embedded in a telecommunications chip.

The measure proposed by the invention of fabricating an integrated circuit having a first circuit part and a second circuit part in many cost-determining exposure planes (with the exception of that exposure plane used to produce the connecting elements or lines) with different masks of different mask sets avoids having to fabricate, for each exposure plane, a special mask which contains the respective mask regions for the first and second circuit part, which makes a significant difference particularly in the case of chips with a small production volume, so that the fabrication method proposed according to the invention leads to a further reduction of costs.

A further advantage is that the second mask set for fabricating the second circuit part can be reused for each step of the product and possibly for similar products. The first mask set thus produces a reticle which is split or used in shared fashion between one or more product chips (first circuit part) and the second circuit part.

A measure proposed as an option of the fabrication method of conducting a first stepper run for a respective exposure plane for fabricating the first circuit part with the first exposure mask intended therefor and a second stepper run for the second circuit part with the second exposure mask intended therefor increases the flexibility of the process since no loss of area results during mass production. The second mask may either be reused by an intended mask set or lie on a shared reticle.

The above and further advantageous features of the integrated circuit according to the invention and of the fabrication method will become even clearer in the following description of exemplary embodiments with reference to the accompanying figures of the drawing.

DESCRIPTION OF A PREFERRED
EXEMPLARY EMBODIMENT

Figure 1:
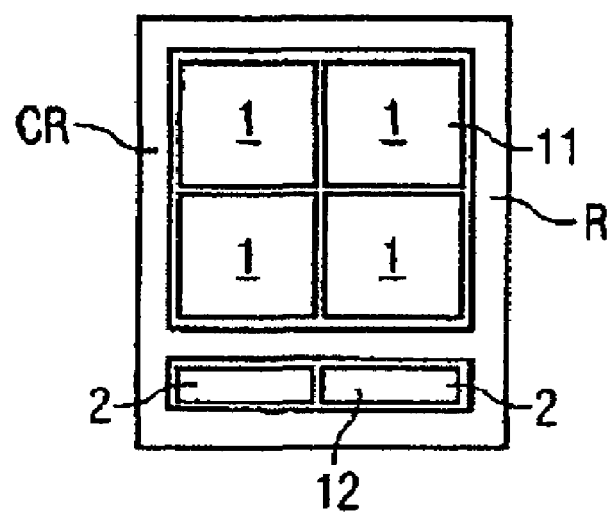
FIG. 1 diagrammatically shows an arrangement of exposure masks serving for fabricating first circuit parts and second circuit parts on a shared reticle.

FIG. 1 shows a first exemplary embodiment of a first mask 11 for producing the first circuit part 1 and second mask 12 for producing the second circuit part 2, arranged on a common reticle R. The edge is not a diaphragm but rather an opaque (e.g., chromium) layer Cr. According to the invention, the combination of the first mask 11 and the second mask 12 as shown in FIG. 1 is used to produce first circuit parts 1 and second circuit parts 2 on a common silicon wafer. For this purpose, each exposure plane, with the exception of the exposure plane used for the connecting elements and lines, can in each case be implemented with a first and second exposure mask 11 and 12 which belong in each case to a first and second mask set intended for the first and second circuit part 1 and 2.

Figure 2A:
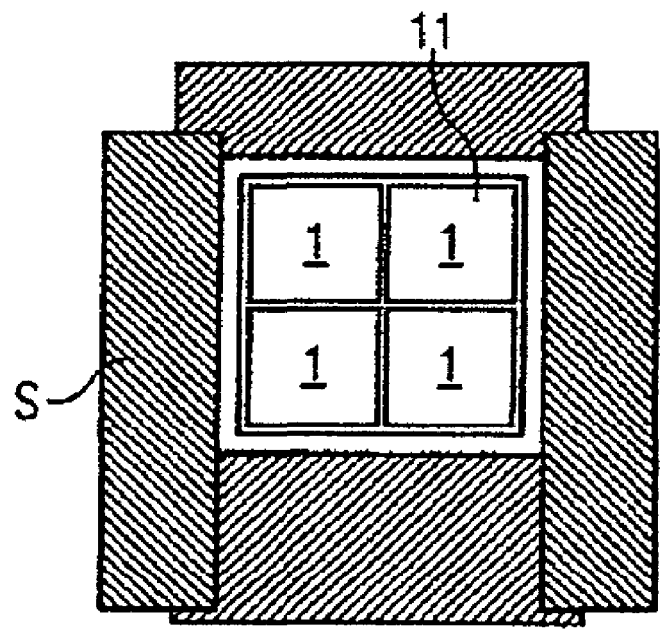
FIGS. 2A and 2B respectively diagrammatically show a mask set for the mass production of the first circuit part and a wafer with regions of the first circuit part exposed thereon.
Figure 2B:
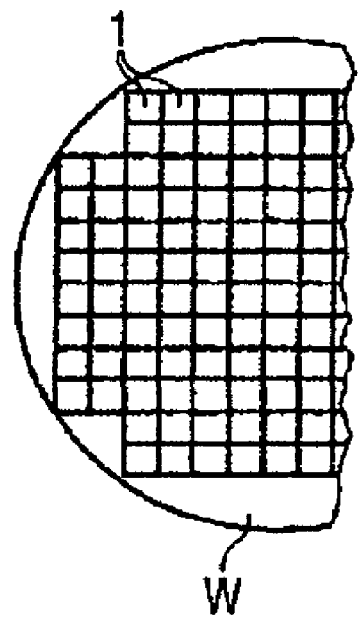

FIGS. 2A and 2B illustrate the case where only first circuit parts 1 are produced on a wafer W with the first mask 11. The mask region 12 serving for producing the second circuit part 2 is covered with a diaphragm S.

Figure 3A:
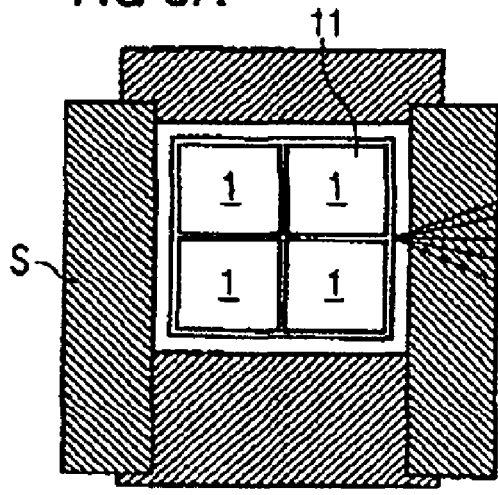
FIGS. 3A and 3B diagrammatically respectively show a mask set for the mass production of the first circuit part and a wafer on which exposed regions of the first circuit parts are formed in a first stepper run.
Figure 3B:
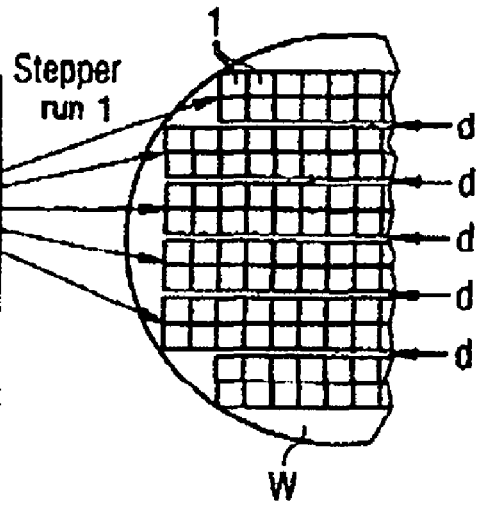
Figure 4A:
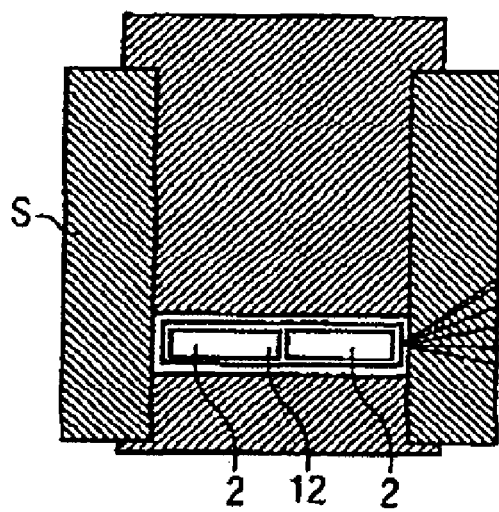
FIGS. 4A and 4B diagrammatically respectively show second circuit parts formed with a second mask set on a wafer in a second stepper run.
Figure 4B:
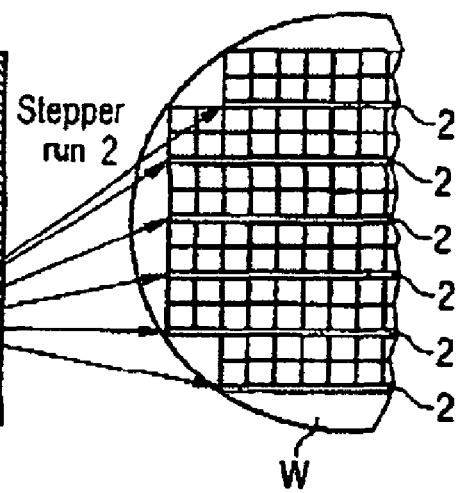

FIGS. 3A, 3B, 4A and 4B diagrammatically show a second exemplary embodiment of a fabrication method according to the invention, by means of which, in a first stepper run in accordance with FIGS. 3A and 3B, first of all first circuit parts 1 are formed on a wafer W with a first mask 11 in such a way that gaps designated by d remain between first circuit parts 1, in which the second circuit parts 2 are then fabricated in accordance with FIGS. 4A and 4B in a second stepper run with a second mask 12. Once again, exactly as in the exemplary embodiment described above, the masks 11 and 12 are particular masks which are in each case intended for fabricating the first circuit parts 1 and the second circuit parts 2.

Figure 5:
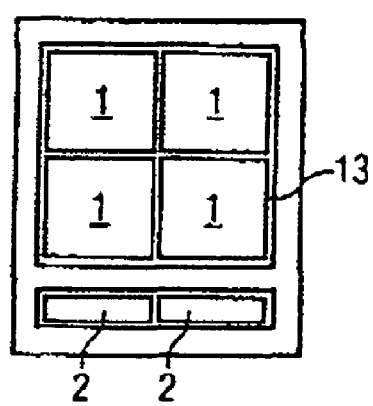
FIG. 5 shows an intended exposure mask for forming connecting elements and lines between the first and the second circuit part.
Figure 6A:
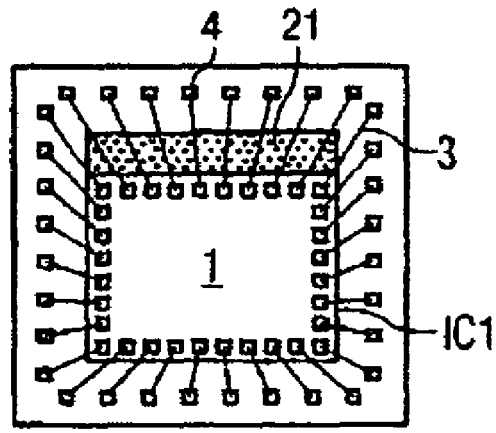
FIGS. 6A, 6B and 6C show three variants of the known integrated circuit already discussed in the introduction.
Figure 6B:
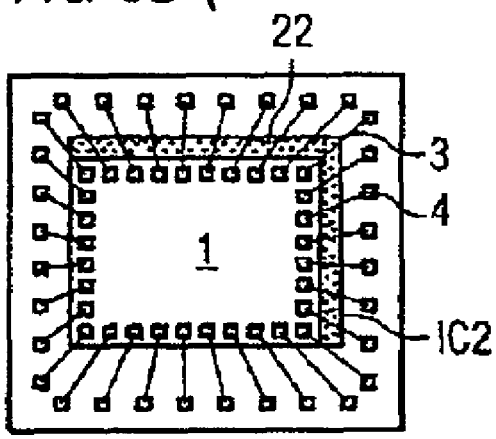
Figure 6C:
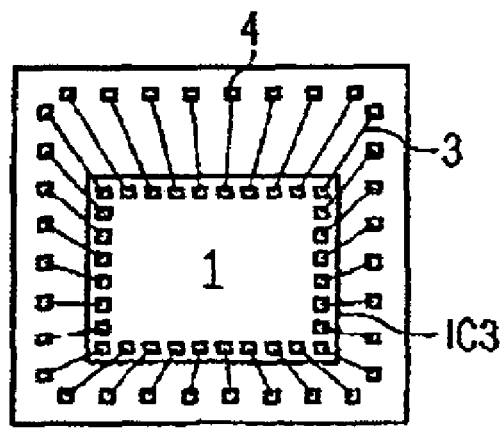
Figure 7:
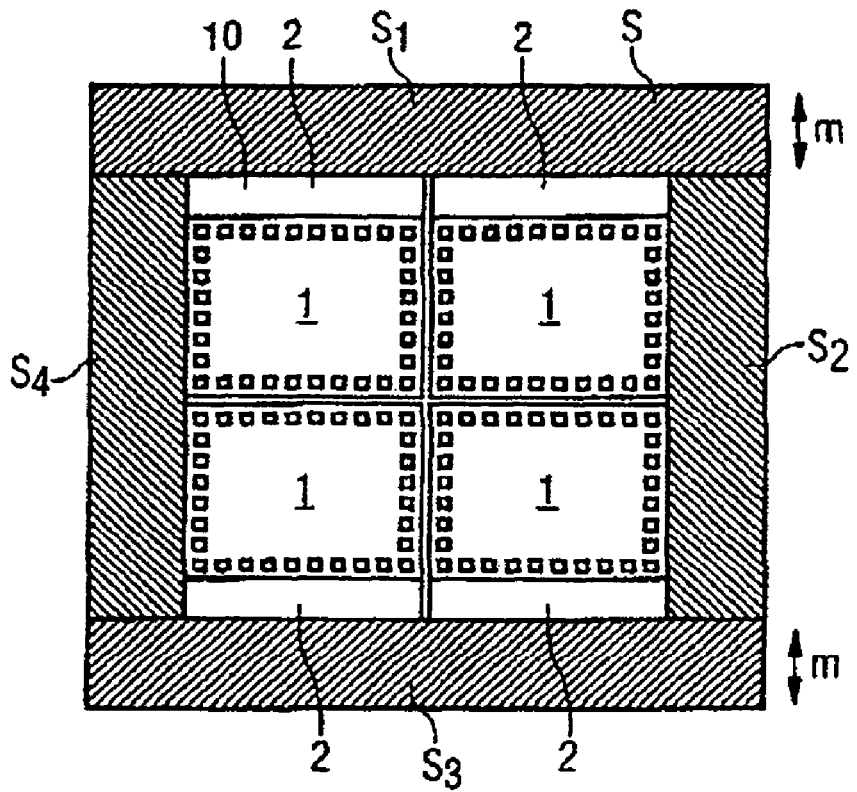
FIG. 7 shows a mask set with diaphragm sections for fabricating an integrated circuit having a first and a second circuit part.
Figure 8:
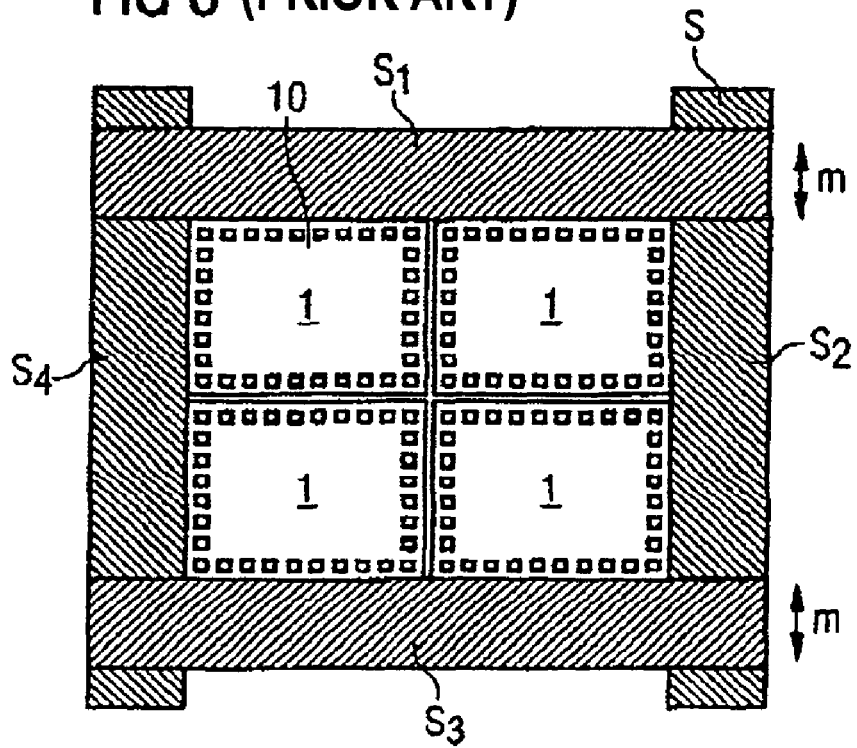
FIG. 8 shows a mask in accordance with FIG. 7, in which the mask regions serving for fabricating the second circuit parts are formed with the displaceable diaphragm sections.

Finally, FIG. 5 shows a third mask 13, which is set up for fabricating the connecting elements or lines between the first circuit part and the second circuit part.

For the integrated circuit fabricated by means of the above-described exemplary embodiments of the fabrication method according to the invention, it holds true that the first circuit part 1 and the second circuit part 2 are connected to one another in such a way that the first circuit part 1 behaves, in terms of its functions, with the exception of the specific functionality, when the second circuit part 2 is not present, in exactly the same way as is the case when the second circuit part 2 is present. Furthermore, the separate regions of the first circuit part 1 and of the second circuit part 2 are not interleaved in one another on the silicon wafer, nor do they overlap. This cannot, of course, hold true for the connecting elements or lines leading between the two circuit parts.

The above description shows that the first circuit part on a wafer W is fabricated in mass production, and that the second circuit part is produced only for a specific fraction of the first circuit parts.

In the preferred application, the first circuit part realizes a program-controlled processor or controller circuit and the second circuit part 2 realizes an emulator circuit for the first circuit part.

What emerges as a principal advantage of the invention is that the mask set for the second circuit part can be reused for each step of the product and possibly also for similar products.

The process realized with the successive first and second stepper run in accordance with the second exemplary embodiment described above achieves the flexibility that no area overhang occurs during mass production. The masks 12 for fabricating the second circuit part may either be reused from an intended mask set or be situated on a common reticle.

LIST OF REFERENCE SYMBOLS 1 first circuit part or processor circuit
2, 21, 22 second circuit part or emulator circuit bonding wires terminals of the bonding wires
IC1, IC2, IC3, IC integrated circuit (silicon wafer)
S diaphragm
S1, S3 displaceable diaphragm strips
S2, S4 fixed diaphragm strips
m displacement direction of the displaceable diaphragm strips S1, S3
11 first mask intended for fabricating the first circuit part 1
12 second mask intended for fabricating the second circuit part 2
R reticle
Cr chromiun
W wafer
13 third mask intended for fabricating the connecting lines

I claim:

1. A method for fabricating an integrated circuit, the method comprising:
fabricating a first circuit part and at least one second circuit part, which is assigned to a specific functionality of the first circuit part, in mutually separate and non-overlapping regions of a common silicon wafer, and
forming connecting elements or lines for connecting the first and the at least one second circuit part to one another, wherein
during the fabrication of the first and second circuit parts for each exposure plane, with the exception of one or more exposure planes used for fabricating the connecting elements or lines, use is made in each case of a first exposure mask intended for the first circuit part and a second exposure mask intended for the second circuit part, which belong in each case to a first mask and a second mask set, respectively intended for the first and second circuit parts, and wherein the respective exposure masks intended for the first and second circuit parts are arranged on a common reticle, at least for a portion of the exposure planes, and the mask region for the second circuit part is masked out on the reticle, when only exposure steps for fabricating the first circuit part are performed.

2. The method as claimed in claim 1, wherein, in the exposure plane used for fabricating the connecting elements or lines, the first circuit part and the second circuit part are connected to one another in such a way that the first circuit part behaves, in terms of its functions, with the exception of the specific functionality, when the second circuit part is not present, in exactly the same way as is the case when the second circuit part is present.

3. The method as claimed in claim 1, wherein fabricating the first and second circuit parts further comprises arranging the intended first and second exposure masks in such a way that the the first circuit part and the second circuit part are formed in separated, non-interleaved regions of the silicon wafer.

4. The method as claimed in claim 1, wherein fabricating the first circuit part with the first exposure mask is conducted in a first stepper run, and fabricating the second circuit part with the second exposure mask is conducted in a second stepper run.

5. The method as claimed in claim 1 for fabricating an integrated emulator circuit, in which the first circuit part is a program-controlled processor or controller circuit and the second circuit part is an emulator circuit for the first circuit part.

6. The method as claimed in claim 5, wherein the first circuit part is fabricated in mass production and the second circuit part, in assignment to the first circuit part, is fabricated only for a specific fraction of the latter.

7. A method for fabricating an integrated circuit comprising:
producing a plurality of masks including:
a first mask corresponding to a first circuit part L
a second mask corresponding to a second circuit part, wherein the first circuit part and the second circuit part are formed on a common reticle and separated by an opaque border region, and
a third mask including a first portion associated with the first circuit part, a second portion associated with the second circuit part, and at least one of connecting elements and lines extending between the first portion and the second portion;
forming a plurality of said first circuit parts on a wafer by covering the second mask and sequentially positioning the first mask over a plurality of regions of the wafer, wherein at least some of the plurality of said first circuit parts are separated by at least one gap region;
forming a second circuit part on the wafer in said gap region by covering the first mask and positioning the second mask over said gap region; and
forming at least one of said connecting elements and said lines between said second circuit part and a corresponding first circuit part of the plurality of first circuit parts by positioning the third mask such that the first portion is located over the corresponding first circuit part and the second portion is positioned over the second circuit part.

* * * * *